(12) United States Patent
Kojima et al.

(10) Patent No.: US 8,133,811 B2
(45) Date of Patent: Mar. 13, 2012

(54) SEMICONDUCTOR DEVICE MANUFACTURING METHOD, SEMICONDUCTOR DEVICE MANUFACTURING APPARATUS, COMPUTER PROGRAM AND STORAGE MEDIUM

(75) Inventors: Yasuhiko Kojima, Nirasaki (JP); Taro Ikeda, Nirasaki (JP); Tatsuo Hatano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 160 days.

(21) Appl. No.: 12/374,228

(22) PCT Filed: Jun. 15, 2007

(86) PCT No.: PCT/JP2007/062140
§ 371 (c)(1),
(2), (4) Date: Jan. 16, 2009

(87) PCT Pub. No.: WO2008/010371
PCT Pub. Date: Jan. 24, 2008

(65) Prior Publication Data
US 2010/0015799 A1    Jan. 21, 2010

(30) Foreign Application Priority Data
Jul. 20, 2006 (JP) .................................. 2006-197671

(51) Int. Cl.
*H01L 21/44* (2006.01)
(52) U.S. Cl. ........ 438/679; 438/680; 438/683; 438/687; 257/E21.16; 257/E21.161

(58) Field of Classification Search .......... 438/679–687; 257/E21.16, E21.161
See application file for complete search history.

(56) References Cited

U.S. PATENT DOCUMENTS

| | | | |
|---|---|---|---|
| 5,447,599 A * | 9/1995 | Li et al. .......................... 216/17 |
| 7,034,397 B2 * | 4/2006 | Raaijmakers et al. ........ 257/750 |
| 2002/0052109 A1 | 5/2002 | Zhang et al. |
| 2003/0072880 A1 | 4/2003 | Pan et al. |
| 2004/0212093 A1 * | 10/2004 | Chopra et al. ................ 257/762 |
| 2005/0206000 A1 * | 9/2005 | Aggarwal et al. ............. 257/758 |
| 2007/0072415 A1 * | 3/2007 | Suzuki .......................... 438/652 |

FOREIGN PATENT DOCUMENTS

| JP | 10 229084 | 8/1998 |
| JP | 2002 60942 | 2/2002 |
| JP | 2003 124145 | 4/2003 |

* cited by examiner

*Primary Examiner* — Khiem D Nguyen
(74) *Attorney, Agent, or Firm* — Oblon, Spivak, McClelland, Maier & Neustadt, L.L.P.

(57) ABSTRACT

A semiconductor device, which suppresses formation of an organic impurity layer and has excellent adhesiveness to a copper film and a metal to be a base, is manufactured. A substrate (wafer W) coated with a barrier metal layer (base film) 13 formed of a metal having a high oxidation tendency, such as titanium, is placed in a processing chamber. At the time of starting to supply water vapor or after that, a material gas containing an organic compound of copper (for instance, Cu(hfac)TMVS) is supplied, and a copper film is formed on the surface of the barrier metal layer 13 whereupon the oxide layer 13*a* is formed by the water vapor. Then, heat treatment is performed on the wafer W, and the oxide layer 13*a* is converted into an alloy layer 13*b* of a metal and copper which constitute the barrier metal layer 13.

5 Claims, 11 Drawing Sheets

SEMICONDUCTOR DEVICE MANUFACTURING METHOD, SEMICONDUCTOR DEVICE MANUFACTURING APPARATUS, COMPUTER PROGRAM AND STORAGE MEDIUM

FIELD OF THE INVENTION

The present invention relates to a technology for manufacturing a semiconductor device having excellent adhesiveness between a copper film for wiring and a base film thereof.

BACKGROUND OF THE INVENTION

In a recent wiring technology, copper lines are replacing aluminum lines to improve performance of a semiconductor device. In a manufacturing process of the semiconductor device, a technology for forming a copper film on a surface of a semiconductor wafer (hereinafter, referred to as a "wafer") is important. A chemical vapor deposition method (hereinafter, referred to as "CVD") using a copper organic compound as a material has been known as one of technologies for forming a copper film on the wafer.

When a copper film is formed on the wafer by using CVD, a copper organic compound, e.g., Cu(hexafluoroacetylacetonate) trimethylvinylsilane (hereinafter, referred to as "Cu(hfac)TMVS") serving as a source gas is supplied to a processing chamber in a vacuum state, and the Cu(hfac)TMVS is thermally decomposed on the heated wafer to form the copper film on the surface of the wafer. However, since copper atoms tend to be diffused into the wafer, in most cases, the copper film is formed on a diffusion barrier film (base film) called a barrier metal, which is formed in advance on the wafer, instead of being directly formed on the wafer. The base film employs titanium, tantalum or nitride thereof. When the base film is made of a metal having a high oxidation tendency, an organic impurity layer is formed between the base film and the copper film.

When the organic impurity layer is interposed between the base film and the copper film, adhesiveness between the base film and the copper film is weakened and a resistance between an upper copper line and a lower copper line increases. Accordingly, electrical characteristics deteriorate or the copper film is peeled off while processing the wafer, resulting in a reduction in production yield. Further, since the organic impurity layer has poorer wettability than the base film, copper can be easily aggregated to thereby reduce buriability of the copper in a trench having a high aspect ratio, thereby causing a defect of the copper line.

In order to solve the above-mentioned problem of formation of the organic impurity layer, Patent Document 1 discloses a technique using water vapor. In accordance with the technique disclosed in Patent Document 1, CVD is performed after water vapor is supplied to a processing chamber containing a wafer, thereby preventing formation of an organic impurity layer.

However, in the CVD using Cu(hfac)TMVS as a material, the water vapor oxidizes a surface of the base film made of a metal having a high oxidation tendency (that is, easily oxidized) to thereby form an oxide layer between the base film and the copper film though it prevents formation of the organic impurity layer. The oxide layer decreases adhesiveness between the base film and the copper film. Accordingly, although the formation of the organic impurity layer is prevented, it is difficult to improve adhesiveness between the copper film and the base film.

Further, according to the investigation of the inventors, when the CVD using Cu(hfac)TMVS as a material is performed in an atmosphere containing water vapor, it is possible to reduce a film forming temperature (wafer temperature) of the copper film. As known in the art, the reduction of the film forming temperature can improve morphology of the surface of the copper film (reduce irregularity of the surface) and prevent a void from being formed in a copper line. From the above-mentioned facts, it is an important object to perform the CVD under an atmosphere containing water vapor without causing problems such as reduction in adhesiveness due to formation of the oxide layer.

Patent Document 1: Japanese Laid-open Application No. 2002-60942: paragraphs [0037] and [0038] on page 5, and paragraph [0057] on page 6

SUMMARY OF THE INVENTION

It is an object of the present invention to provide a method for manufacturing a semiconductor device having excellent adhesiveness between a copper film and a base film thereof while preventing formation of an organic impurity layer, an apparatus for manufacturing the semiconductor device, a computer program of the semiconductor device manufacturing method and a storage medium for storing the computer program.

In accordance with a first aspect of the present invention, there is provided a semiconductor device manufacturing method comprising: placing a substrate having on its surface a base film made of a metal having a high oxidation tendency in an airtightly sealed processing chamber; supplying water vapor to the processing chamber; forming a copper film on a surface of the base film having an oxide layer formed due to the water vapor by supplying a source gas containing an organic compound of copper to the processing chamber while or after supplying the water vapor; and converting the oxide layer into an alloy layer of the metal for forming the base film and copper by performing a heat treatment on the substrate having the copper film.

In the semiconductor device manufacturing method, the metal having a high oxidation tendency may be titanium or tantalum.

In accordance with a second aspect of the present invention, there is provided a semiconductor device manufacturing method comprising: placing a substrate having on its surface a base film made of a metal having a low oxidation tendency in an airtightly sealed processing chamber; supplying water vapor to the processing chamber; and forming a copper film on a surface of the base film by supplying a source gas containing an organic compound of copper to the processing chamber while or after supplying the water vapor.

In the semiconductor device manufacturing method, the metal having a low oxidation tendency may be selected from the group consisting of ruthenium, iridium, silver, palladium, osmium and cobalt.

In the semiconductor device manufacturing method, a second base film made of a metal having a high oxidation tendency may be coated between the substrate and the base film.

In the semiconductor device manufacturing method, the second base film may be made of titanium or tantalum.

In accordance with a third aspect of the present invention, there is provided a semiconductor device manufacturing method comprising: placing a substrate in an airtightly sealed processing chamber; coating a base film of ruthenium on a surface of the substrate in a vacuum atmosphere by supplying a first source gas containing a compound of ruthenium to the processing chamber; and forming a copper film on a surface of the base film in a vacuum atmosphere by supplying a second source gas containing an organic compound of copper to the processing chamber while the substrate is placed in the processing chamber, or after the substrate is loaded in a separate processing chamber without breaking a vacuum atmosphere.

In accordance with a fourth aspect of the present invention, there is provided a semiconductor device manufacturing apparatus which includes a transfer chamber provided with a substrate transfer unit and first and second processing chambers airtightly connected to the transfer chamber, the apparatus comprising: a water vapor supply unit connected to the first processing chamber to supply water vapor to the first processing chamber; a source gas supply unit connected to the first processing chamber to supply a source gas containing an organic compound of copper to the first processing chamber; a heating unit provided in the second processing chamber to perform a heat treatment on a substrate in the second processing chamber; and a controller for controlling the water vapor supply unit, the source gas supply unit and the heating unit, wherein the controller controls the respective units to perform a step of placing a substrate having on its surface a base film made of a metal having a high oxidation tendency in the first processing chamber, a step of supplying water vapor to the first processing chamber, a step of forming a copper film on a surface of the base film having an oxide layer formed due to the water vapor by supplying a source gas containing an organic compound of copper to the processing chamber while or after supplying the water vapor, a step of transferring the substrate having the copper film from the first processing chamber to the second processing chamber by using the substrate transfer unit such that the substrate is placed in the second processing chamber, and a step of performing a heat treatment on the substrate by using the heating unit provided in the second processing chamber to convert the oxide layer into an alloy layer of the metal for forming the base film and copper.

In the semiconductor device manufacturing apparatus, the metal having a high oxidation tendency may be titanium or tantalum.

In accordance with a fifth aspect of the present invention, there is provided a semiconductor device manufacturing apparatus comprising: a processing chamber in which a substrate is placed; a first source gas supply unit connected to the processing chamber to supply a first source gas containing a compound of ruthenium to the processing chamber; a second source gas supply unit connected to the processing chamber to supply a second source gas containing an organic compound of copper to the processing chamber; and a controller for controlling the first source gas supply unit and the second source gas supply unit, wherein the controller controls the respective units to perform a step of placing a substrate in the processing chamber, a step of coating a base film made of ruthenium on a surface of the substrate by supplying a first source gas containing a compound of ruthenium to the processing chamber by using the first source gas supply unit, and a step of forming a copper film on a surface of the base film by supplying a source gas containing an organic compound of copper to the processing chamber by using the second source gas supply unit.

The semiconductor device manufacturing apparatus may further include a water vapor supply unit connected to the processing chamber to supply water vapor to the processing chamber, wherein the controller controls the respective units to perform, after the step of coating a base film made of ruthenium on a surface of the substrate by supplying a first source gas by using the first source gas supply unit, a step of supplying water vapor to the processing chamber by the water vapor supply unit, and a step of forming a copper film on a surface of the base film by supplying a second source gas containing an organic compound of copper to the processing chamber by using the second source gas supply unit while or after supplying the water vapor.

In accordance with a sixth aspect of the present invention, there is provided a computer program for performing a semiconductor device manufacturing method on a computer, wherein the semiconductor device manufacturing method includes: placing a substrate having on its surface a base film made of a metal having a high oxidation tendency in an airtightly sealed processing chamber; supplying water vapor to the processing chamber; forming a copper film on a surface of the base film having an oxide layer formed due to the water vapor by supplying a source gas containing an organic compound of copper to the processing chamber while or after supplying the water vapor; and converting the oxide layer into an alloy layer of the metal for forming the base film and copper by performing a heat treatment on the substrate having the copper film.

In accordance with a seventh aspect of the present invention, there is provided a computer program for performing a semiconductor device manufacturing method on a computer, wherein the semiconductor device manufacturing method includes: placing a substrate having on its surface a base film made of a metal having a low oxidation tendency in an airtightly sealed processing chamber; supplying water vapor to the processing chamber; and forming a copper film on a surface of the base film by supplying a source gas containing an organic compound of copper to the processing chamber while or after supplying the water vapor.

In accordance with an eighth aspect of the present invention, there is provided a computer program for performing a semiconductor device manufacturing method on a computer, wherein the semiconductor device manufacturing method includes: placing a substrate in an airtightly sealed processing chamber; coating a base film of ruthenium on a surface of the substrate in a vacuum atmosphere by supplying a first source gas containing a compound of ruthenium to the processing chamber; and forming a copper film on a surface of the base film in a vacuum atmosphere by supplying a second source gas containing an organic compound of copper to the processing chamber while the substrate is placed in the processing chamber, or after the substrate is loaded in a separate processing chamber without breaking a vacuum atmosphere.

In accordance with a ninth aspect of the present invention, there is provided a storage medium storing a computer program for performing a semiconductor device manufacturing method on a computer, wherein the semiconductor device manufacturing method includes: placing a substrate having on its surface a base film made of a metal having a high oxidation tendency in an airtightly sealed processing chamber; supplying water vapor to the processing chamber; forming a copper film on a surface of the base film having an oxide layer formed due to the water vapor by supplying a source gas containing an organic compound of copper to the processing chamber while or after supplying the water vapor; and converting the oxide layer into an alloy layer of the metal for forming the base film and copper by performing a heat treatment on the substrate having the copper film.

In accordance with a tenth aspect of the present invention, there is provided a storage medium storing a computer program for performing a semiconductor device manufacturing method on a computer, wherein the semiconductor device manufacturing method includes: placing a substrate having on its surface a base film made of a metal having a low oxidation tendency in an airtightly sealed processing chamber; supplying water vapor to the processing chamber; and forming a copper film on a surface of the base film by supplying a source gas containing an organic compound of copper to the processing chamber while or after supplying the water vapor.

In accordance with an eleventh aspect of the present invention, there is provided a storage medium storing a computer program for performing a semiconductor device manufacturing method on a computer, wherein the semiconductor device manufacturing method includes: placing a substrate in an airtightly sealed processing chamber; coating a base film of ruthenium on a surface of the substrate in a vacuum atmosphere by supplying a first source gas containing a compound of ruthenium to the processing chamber; and forming a copper film on a surface of the base film in a vacuum atmosphere by supplying a second source gas containing an organic compound of copper to the processing chamber while the substrate is placed in the processing chamber, or after the substrate is loaded in a separate processing chamber without breaking a vacuum atmosphere.

In accordance with an embodiment of the present invention, when a copper film is formed on a base film of titanium, tantalum or the like having a high oxidation tendency by using an organic compound of copper such as Cu(hfac)T-MVS as a material, water vapor is supplied and film formation is performed in presence of water vapor in order to prevent formation of an organic impurity layer and reduce a film forming temperature. In this case, an oxide layer of poor adhesiveness to the copper film is formed on the surface of the base film. However, a heat treatment is performed on a substrate such that the oxide layer is converted into an alloy layer of metal and copper. The alloy layer has high adhesiveness to both the copper film and the base film, thereby improving adhesiveness between the copper film and the base film.

Further, in accordance with another embodiment of the present invention, the copper film is formed on the base film made of a metal having a low oxidation tendency. Accordingly, an oxide layer is prevented from being formed on the surface of the base film even though film formation is performed in presence of water vapor, thereby forming the copper film having excellent adhesiveness to the base film.

DETAILED DESCRIPTION OF THE EMBODIMENTS

In a semiconductor device manufacturing method in accordance with a first embodiment of the present invention, first, a copper film is formed by CVD on a wafer having on its surface a barrier metal layer (base film) of a metal (e.g., titanium or tantalum) having a high oxidation tendency. In this case, film formation is performed while supplying water vapor in order to prevent formation of an organic impurity layer and reduce a film forming temperature. In this case, the surface the barrier metal layer is oxidized to form an oxide layer of poor adhesiveness to the copper film. Accordingly, a heat treatment is performed on the wafer on which the copper film is formed, and the oxide layer is converted into an alloy layer of barrier metal and copper, thereby improving adhesiveness to the copper film. In the first embodiment of the present invention, a case in which the copper film is formed or the heat treatment is performed by using a semiconductor manufacturing apparatus called a cluster tool or a multi chamber will be described.

Figure 1:
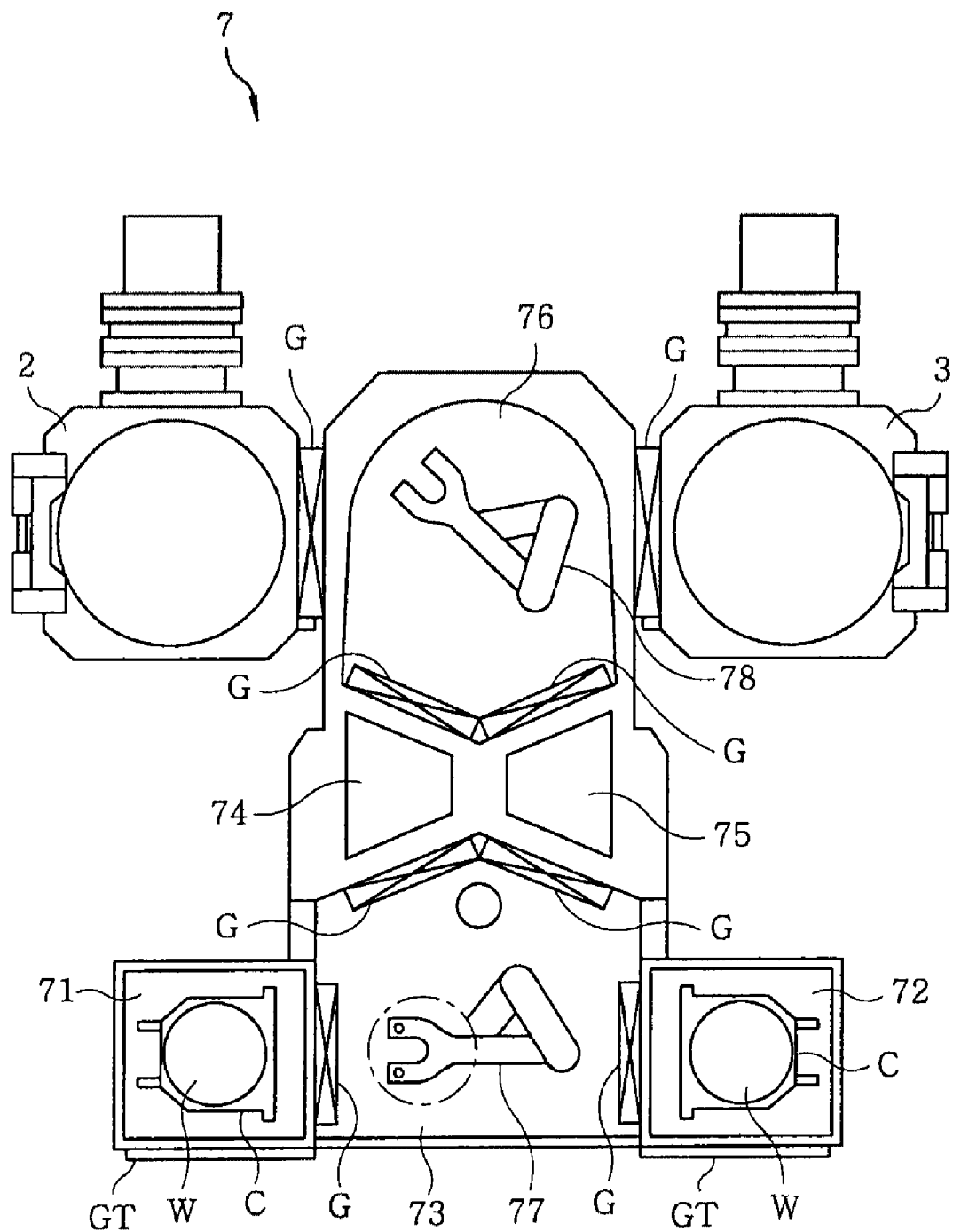
FIG. 1 is a plan view showing a semiconductor manufacturing apparatus in accordance with a first embodiment of the present invention.

FIG. 1 is a plan view showing a cluster tool (semiconductor manufacturing apparatus 7) in accordance with the first embodiment of the present invention. The semiconductor manufacturing apparatus 7 includes two carrier chambers 71 and 72 for receiving carriers (transfer containers) C containing wafers W from an atmospheric side through a gate door GT, first and second transfer chambers 73 and 76, preliminary vacuum chambers 74 and 75 provided between the first and second transfer chambers 73 and 76, and a CVD apparatus 2 for performing a copper film on the wafer W, and a heat treatment apparatus 3 for performing a heat treatment on the wafer W having the copper film. The first and second transfer chambers 73 and 76 and the preliminary vacuum chambers 74 and 75 are airtightly sealed from the atmospheric side and may have a vacuum atmosphere or a nonreactive atmosphere. Further, a first transfer unit 77 is provided in the first transfer chamber 73 to transfer the wafer W between the carrier chambers 71 and 72 and the preliminary vacuum chambers 74 and 75, and a second transfer unit 78 is provided in the second transfer chamber 76 to transfer the wafer W between the preliminary vacuum chambers 74 and 75, the CVD apparatus 2 and the heat treatment apparatus 3.

Figure 2:
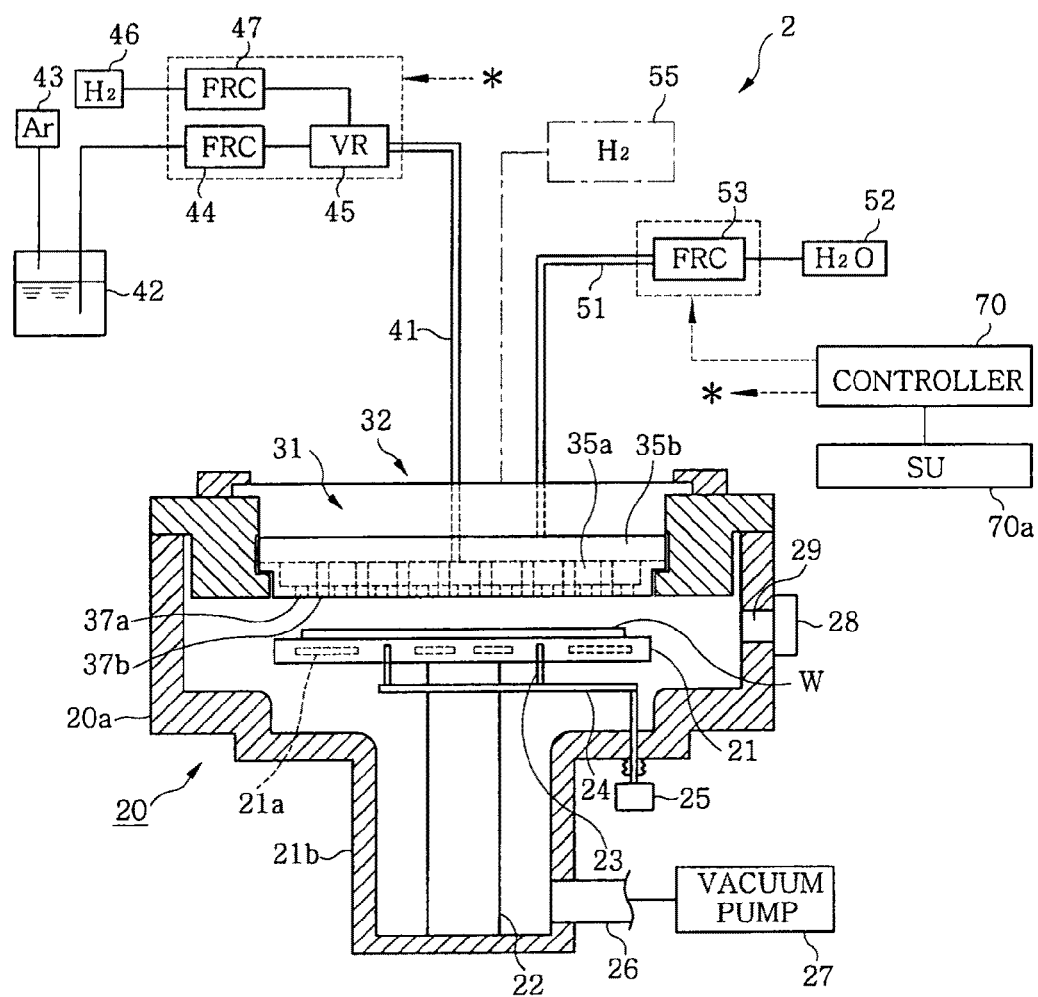
FIG. 2 is a cross sectional view showing an example of a CVD apparatus in accordance with the first embodiment of the present invention.

First of all, the apparatus for forming a copper film will be described with reference to FIG. 2. FIG. 2 is a cross sectional view showing an example of the CVD apparatus 2 for performing film formation of a copper film. The CVD apparatus 2 has a processing chamber (vacuum chamber) 20 formed of, for example, aluminum. The processing chamber 20 is formed in a mushroom shape and includes an upper large-diameter cylindrical part 20a and a lower small-diameter cylindrical part 20b connected to each other. A heating unit (not shown) is provided in the processing chamber 20 to heat an inner wall of the processing chamber 20. A stage 21 for horizontally mounting the wafer W thereon is provided in the processing chamber 20. The stage 21 is supported by a support member 22 at a bottom portion of the small-diameter cylindrical part 20b.

A heater 21a serving as a temperature control device of the wafer W is provided in the stage 21. Further, the stage 21 is provided with, for example, three elevating pins 13 capable of vertically moving the wafer W while being protruded from a surface of the stage 21 and retracted into the stage 21, thereby performing a delivery of the wafer W to/from the second transfer unit 78. The elevating pins 23 are connected to an elevating mechanism 25 located outside the processing chamber 20 through a support member 24. A bottom portion of the processing chamber 20 is connected one end of an exhaust pipe 26, and a vacuum pump 27 is connected to the other end of the exhaust pipe 26. Further, a transfer port 29 which is opened and closed by using a gate valve 28 is formed at a sidewall of the large-diameter cylindrical part 20a of the processing chamber 20.

Further, an opening 31 is formed at a ceiling portion of the processing chamber 20. A gas shower head 32 is provided to close the opening 31 and face the stage 21. The gas shower head 32 has two gas chambers 33a and 33b and two type gas supply holes 34a and 34b. A gas supplied to the gas chamber 33a is supplied into the processing chamber 20 through the gas supply holes 34a and a gas supplied to the gas chamber 33b is supplied into the processing chamber 20 through the gas supply holes 34b.

A source gas supply line 41 is connected to the lower gas chamber 35a. A source tank 42 is connected to an upstream side of the source gas supply line 41. The source tank 42 contains Cu(hfac)TMVS in a liquid state, which is a copper organic compound (complex) serving as a material (precursor) of a copper film. The source tank 42 is also connected to a compressor 43. An inside of the source tank 42 is compressed by an Ar gas or the like supplied from the compressor 43 such that the Cu(hfac)TMVS is pushed toward the gas shower head 32. Further, a flow rate controller 44 including a liquid mass flow controller and a valve and a vaporizer 35 for vaporizing Cu(hfac)TMVS is provided in the source gas supply line 41 sequentially from its upstream side. The vaporizer 45 vaporizes the Cu(hfac)TMVS by contact-mixing the Cu(hfac)TMVS with a carrier gas (hydrogen gas) supplied from a carrier gas supply source 46 and supplies the Cu(hfac) TMVS gas to the lower gas chamber 35a. In FIG. 2, a reference numeral '47' designates a flow rate controller (FRC) for controlling a flow rate of a carrier gas.

Next, a gas supply system of water vapor is explained. The upper gas chamber 35b is connected a water vapor supply line 51. A water vapor supply source 52 is connected to the water vapor supply line 51 through a flow rate controller 53.

Further, gas supply controllers (represented by dotted lines) connected to gas supply systems of Cu(hfac)TMVS gas and water vapor, a pressure controller (not shown) provided in the exhaust pipe 26, the heater 21a, the elevating mechanism 25 and the like are controlled by a controller 70 for controlling an entire operation of the semiconductor manufacturing apparatus 7. The controller 70 includes, for example, a computer having a program storage part (not shown). The program storage part stores a computer program including steps (commands) of an operation or a process for loading/unloading the wafer W to/from the processing chamber 20. Further, the controller 70 controls the entire operation of the CVD apparatus 2 by reading the corresponding computer program. Further, the computer program is stored in the program storage part by being stored in a storage unit 70a such as a hard disk, a compact disk, a magneto-optical disk, a memory card or the like.

Next, the heat treatment apparatus 3 for converting an oxide layer formed on the surface of the barrier metal layer in the film formation in the CVD apparatus 2 into an alloy layer of barrier metal and copper will be described. The heat treatment apparatus 3 has substantially the same configuration as that of, e.g., the CVD apparatus 2 shown in FIG. 2. Accordingly, in the following description, the heat treatment apparatus 3 will be described with reference to the CVD apparatus 2 shown in FIG. 2. A processing chamber 20 of the heat treatment apparatus 3 has the same configuration as that of the CVD apparatus 2. On the other hand, the gas shower head 32 is connected to a hydrogen gas supply system 55 instead of the supply systems of Cu(hfac)TMVS gas and water vapor (see FIG. 2). The heat treatment is performed on the wafer W under an atmosphere of a hydrogen gas supplied form the hydrogen gas supply system 55. Further, the heater 21a serving as a temperature control device provided in the stage 21 is adjusted at a set temperature to heat the wafer W to, e.g., 400° C. Further, the gas supply controller of the heat treatment apparatus 3, the heater 21a and the like are controlled by the controller 70 of the semiconductor manufacturing apparatus 7 in the same manner as the CVD apparatus 2. A loading/unloading operation of the wafer W, the supply and stop of hydrogen gas, a temperature rise of the heater or the like is performed on the program stored in the program storage part.

Figure 3A:
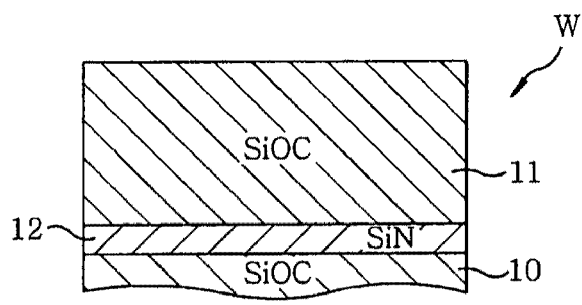
FIGS. 3A to 3D are cross sectional views showing a surface portion of a semiconductor device formed in accordance with the first embodiment of the present invention.

Hereinafter, a semiconductor device manufacturing method using the semiconductor manufacturing apparatus 7 having the above configuration will be described. FIGS. 3A to 3D are cross sectional views showing a process for manufacturing a semiconductor device formed on a surface of the wafer W. FIG. 3A illustrates a state before a trench is formed in an interlayer insulating film. Further, for simplicity of description, copper is assumed to be buried by a single damascene method and FIGS. 3A to 3D show cross sectional views of a region having no via hole. Reference numerals '10' and '11' designate SiOC films (carbon-containing silicon oxide films) serving as interlayer insulating films, and a reference numeral '12' designates an SiN film (silicon nitride film).

Figure 3B:
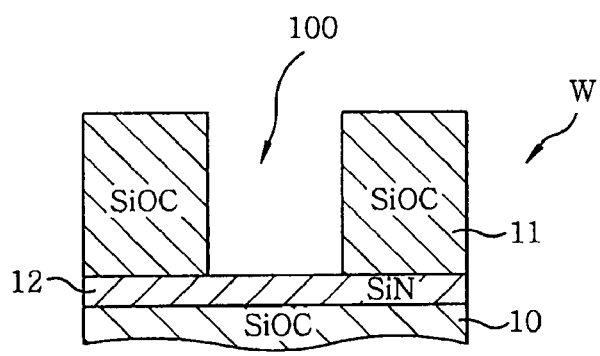

In this case, the SiOC films 10 and 11 and the SiN film 12 can be formed on the wafer W by, e.g., a plasma film forming process. First, the SiOC film 11 is etched in a specific pattern shape through a patterned photoresist mask by using, for example, a $CF_4$ gas or $C_4F_8$ gas as an etching gas. In this case, the SiN film 12, which is a base film of the SiOC film 11, serves as an etching stopper. Accordingly, for example, as shown in FIG. 3B, a trench 100 having a line width of, e.g., about 100 nm is formed in the SiOC film 11 to bury copper for wiring therein.

Figure 3C:
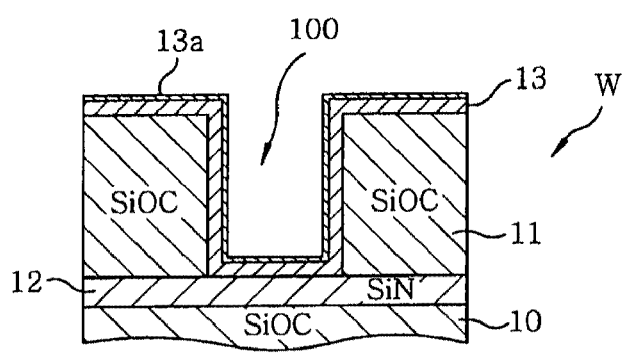

Subsequently, for example, as shown in FIG. 3C, a base film (barrier metal layer) 13 of titanium, tantalum or the like having a high oxidation tendency is coated on the surface of the SiOC film 11 having the trench 100 by sputtering. In this case, the oxidation tendency represents an enthalpy in combination of metal and oxygen. In this embodiment, a metal having an enthalpy such that the metal reacts with water vapor at a film forming temperature of copper to form an oxide layer is referred to as a "metal having a high oxidation tendency."

Further, at a temperature of 200° C., an enthalpy in combination of titanium and oxygen is 722 kJ/mol, and an enthalpy in combination of tantalum and oxygen is 659 kJ/mol. Hereinafter, a case of using titanium as the barrier metal layer 13 in this embodiment will be described.

The wafer W having the barrier metal layer 13 coated on its surface is loaded into the carrier chamber 71 or 72 of the semiconductor manufacturing apparatus 7 shown in FIG. 1. Then, the wafer W is delivered by using the first transfer unit 77 through the preliminary vacuum chambers 74 and 75 to the second transfer unit 78. First, the second transfer unit 78 transfers the delivered wafer W to the CVD apparatus 2. In the CVD apparatus 2, copper is buried in the trench 100. Specifically, the wafer W loaded in the processing chamber 20 is delivered to the elevating pins 23 from the second transfer unit 78 and mounted on the stage 21. Then, the wafer W is heated to, e.g., about 100° C. to 150° C. and the processing chamber 20 is made to have a vacuum atmosphere. Thereafter, water vapor is supplied at a flow rate of, e.g., 5 sccm to the processing chamber 20. In this case, since titanium of the barrier metal layer 13 having a high oxidation tendency is easily oxidized, as shown in FIG. 3C, a thin oxide layer 13a is formed on the surface of the barrier metal layer 13.

Subsequently, the Cu(hfac)TMVS gas of, e.g., 0.5 g/min (mass conversion) and a carrier gas (hydrogen gas) of, e.g., 200 sccm are simultaneously supplied to the processing chamber to bury copper in the trench 100. In the reaction of decomposing the Cu(hfac)TMVS to form the copper film, the water vapor not only prevents formation of the organic impurity layer, but also reduces a film forming temperature (wafer temperature) of the copper film. In the meantime, if the copper film is grown under an atmosphere containing a larger amount of water vapor than necessary, it may cause a defect that the copper is abnormally grown in a needle shape. Accordingly, in order to prevent an abnormal growth of the copper film, preferably, the supply of water vapor is stopped before starting the supply of the Cu(hfac)TMVS gas, or the supply of water vapor is stopped after the Cu(hfac)TMVS gas and the water vapor are supplied for a short period of time of, e.g., 0.5 second. Further, after a copper film having less organic impurities is formed at an interface with the barrier metal layer 13 through these steps, the copper film may be grown while introducing the water vapor at a small amount, e.g., 0.1 sccm, which is sufficiently small enough not to cause an abnormal growth of the copper film, but it is sufficient to reduce a process temperature (wafer temperature) of the CVD.

Figure 3D:
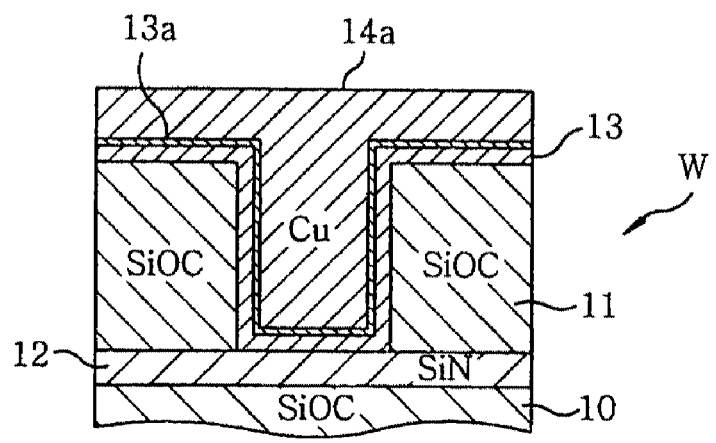

Through these steps, as shown in FIG. 3D, a copper film 14a is formed and copper is buried in the trench 100. However, since the oxide layer 13a is formed on the surface of the barrier metal layer 13, the copper film 14a has poor adhesiveness to the barrier metal layer 13. Accordingly, a heat treatment is performed on the wafer W having the copper film 14a such that the oxide layer 13a is converted into an alloy layer 13b made of copper and titanium (see FIG. 4).

Specifically, after the gate valve 28 of the CVD apparatus 2 is opened, the processed wafer W is delivered to the second transfer unit 78 and the wafer W is loaded into the heat treatment apparatus 3. In the heat treatment apparatus 3, an inner temperature of the processing chamber 20 is increased in advance to a predetermined temperature, and the wafer W is mounted on the stage 21 by the same operation as in the CVD apparatus 2.

In the heat treatment apparatus 3, as the wafer W is heated to, e.g., 400° C. under an atmosphere of a hydrogen gas, the oxide layer 13a is converted into the alloy layer 13b made of copper and titanium. The alloy layer 13b has better adhesiveness to the copper film 14a than the oxide layer 13a. As a result, the adhesiveness between the copper film 14a and the barrier metal layer 13 is improved. Further, a temperature at which the heat treatment is performed on the wafer W is not limited to the above-mentioned temperature, and may be a temperature capable of converting the oxide layer 13a into the alloy layer 13b of copper and titanium.

Then, the processed wafer W is unloaded by using the second transfer unit 78 and delivered to the first transfer unit 77 through the preliminary vacuum chambers 74 and 75. The wafer W is mounted on the carrier chamber 71 or 72 and the operation of the semiconductor manufacturing apparatus 7 is completed.

Figure 4:
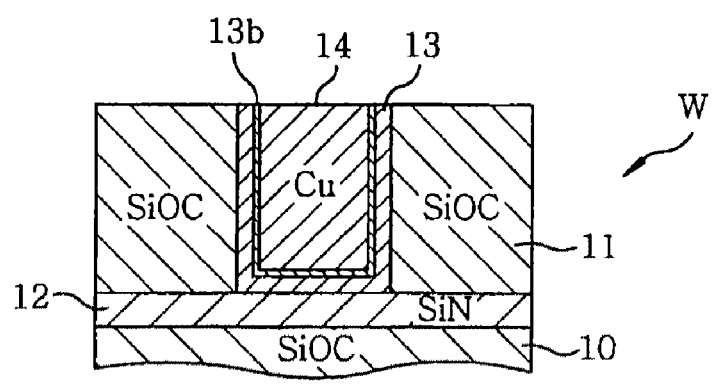
FIG. 4 is a cross sectional view showing a surface portion of a semiconductor device formed in accordance with the first embodiment of the present invention.

A chemical mechanical polishing (CMP) process is performed on the wafer W obtained through the steps. Consequently, as shown in FIG. 4, the copper and the barrier metal layer 13 outside the trench 100 are removed, thereby forming a copper line 14 in the trench 100.

In accordance with the first embodiment of the present invention, following effects can be obtained. That is, it is possible to prevent formation of the organic impurity layer and reduce a film forming temperature by supplying the water vapor when the copper film 14a is formed on the barrier metal layer 13 made of titanium having a high oxidation tendency by using the Cu(hfac)TMVS as a material. On the other hand, although the oxide layer 13a of titanium having poor adhesiveness to the copper film 14a is formed on the surface of the barrier metal layer 13, the oxide layer 13a is converted into the alloy layer 13b of titanium and copper by performing the heat treatment on the substrate. The alloy layer 13b obtained through the heat treatment has high adhesiveness to the copper film 14a, and it is possible to improve adhesiveness between the copper film 14a and the barrier metal layer 13 through the alloy layer 13b. It is possible to reduce troubles such as peel-off of the copper film 14a in processing of CMP or the like.

Next, a second embodiment of the present invention will be described. In both the first and second embodiments, a copper film is formed from Cu(hfac)TMVS with the supply of water vapor. However, the second embodiment has a feature that ruthenium having a low oxidation tendency (difficult to be oxidized) is used as a barrier metal layer. Further, the second embodiment has another feature that the barrier metal layer is coated and the copper film is formed by using the same CVD apparatus.

Figure 5:
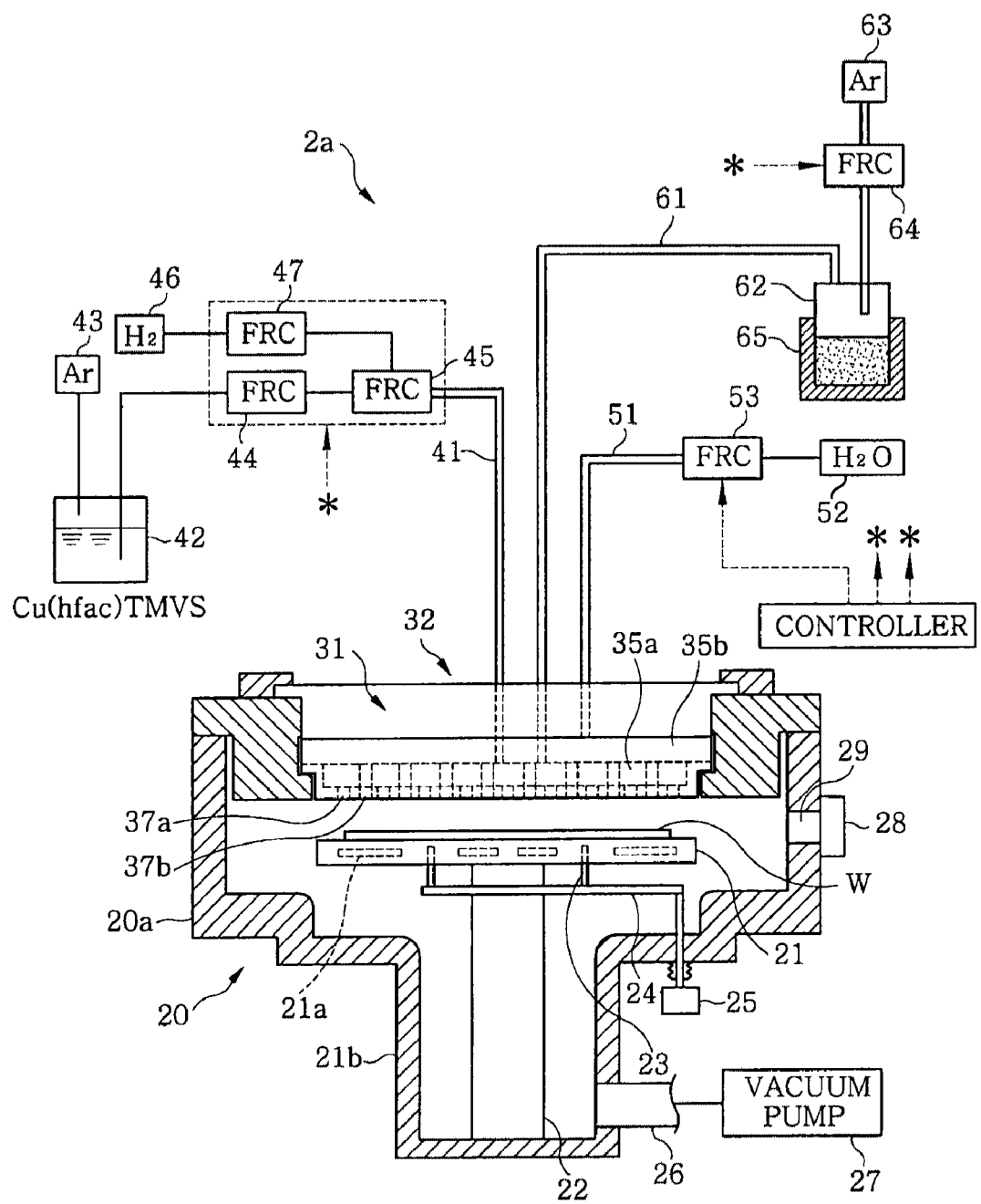
FIG. 5 illustrates a cross sectional view showing an example of a CVD apparatus in accordance with a second embodiment of the present invention.

First, an apparatus for coating a barrier metal layer on the wafer W and forming a copper film on the wafer W will be described with reference to FIG. 5. FIG. 5 illustrates a cross sectional view showing an example of a CVD apparatus 2a for performing coating of the barrier metal layer and film formation of the copper film in the same processing chamber. In the CVD apparatus 2a shown in FIG. 5, the same parts as those of the CVD apparatus 2 used in the first embodiment are designated by the same reference numerals as those of FIG. 2 and a detailed description thereof is omitted.

In the CVD apparatus 2a shown in FIG. 5, parts such as a processing chamber 20 and the supply systems of the Cu(hfac)TMVS gas and the water vapor have the same configurations and functions as those of the CVD apparatus 2 shown in FIG. 4. Accordingly, a detailed description thereof is omitted. The CVD apparatus 2a further includes a supply system of triruthenium dodecacarbonyl $(Ru_3(CO)_{12})$ for forming a barrier metal layer 15.

The supply system is explained in detail. A solid $Ru_3(CO)_{12}$ serving as a material of ruthenium is stored in a source tank 62. A flow rate of an Ar gas from an Ar supply source 63 is controlled by a flow rate controller (mass flow controller) 64, and the Ar gas is introduced into the source tank 62 heated by a heater 65. The solid $Ru_3(CO)_{12}$ is vaporized to have a saturation vapor pressure by heating, and swept by the Ar gas, so that a gas mixture is supplied to a lower gas chamber 35a through a source gas supply line 61. The flow rate of $Ru_3(CO)_{12}$ is uniquely determined from its vapor pressure according to the temperature and pressure of the source tank 62 and the flow rate of the Ar gas. On the other hand, a gas system indicated by a dotted line, flow rate controllers 53 and 64 and the like are controlled by a controller 70.

Figure 6:
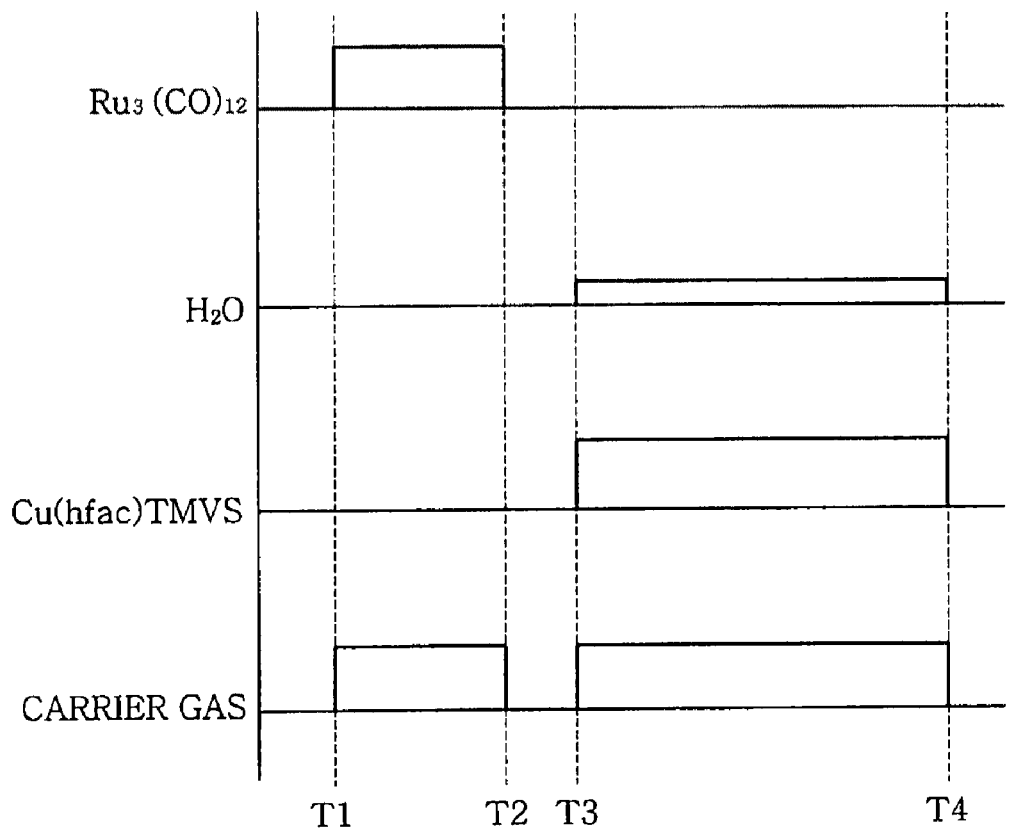
FIG. 6 schematically illustrates an example of a process sequence when coating of a barrier metal layer and formation of a copper film are performed in the same CVD apparatus.

Next, the effect of the CVD apparatus 2a is explained. FIG. 6 schematically illustrates an example of a process sequence in the CVD apparatus 2a. FIGS. 7A to 7D are cross sectional views in a process for manufacturing a semiconductor device formed at a surface portion of the wafer W. Further, parts of the semiconductor device shown in FIGS. 7A to 7D are designated by the same reference numerals as those of FIGS. 3 and 4. Further, the preceding steps, wherein a SiN film 12 and a SiOC film 11 are stacked on a SiOC film 10 (FIG. 7A) and an etching process is performed on the SiOC film 11 to form a trench 100 (FIG. 7B), are the same as those of FIGS. 3A and 3B and, thus, a description thereof is omitted.

Figure 7A:
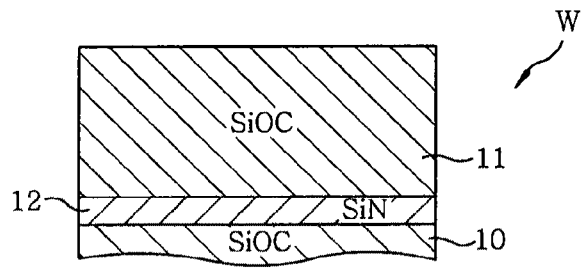
FIGS. 7A to 7D are cross sectional views showing a surface portion of a semiconductor device formed in accordance with the second embodiment of the present invention.
Figure 7B:
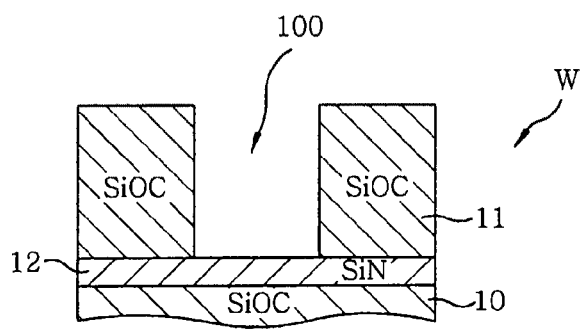
Figure 7C:
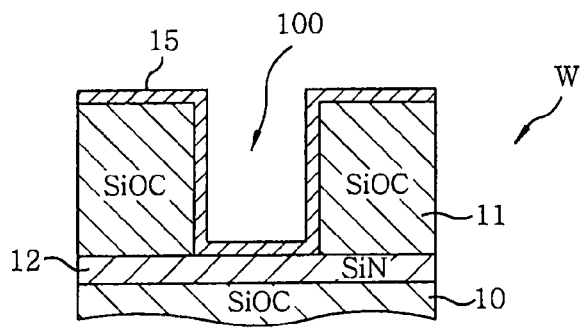

When the wafer W having the trench is mounted on the stage 21 in the CVD apparatus 2a by using a transfer unit provided outside the CVD apparatus 2a, the wafer W is heated to a temperature of, e.g., 150° C. Further, as shown in FIG. 6, the $Ru_3(CO)_{12}$ gas of 0.1 g/min and the carrier gas (hydrogen gas) of, e.g., 100 sccm are simultaneously supplied to the processing chamber 20 during a period from a time T1 to a time T2. Accordingly, the barrier metal layer 15 is coated on the surface of the SiOC film 11 including the trench 100 (FIG. 7C).

Then, the supply of the $Ru_3(CO)_{12}$ gas is stopped, and the water vapor begins to be supplied. Further, as shown in FIG. 6, the Cu(hfac)TMVS gas and the water vapor are simultaneously supplied in a period from the time T3 to the time T4. In this case, a small amount of water vapor, small enough not to cause an abnormal growth of the copper film, is supplied in order to reduce a process temperature of CVD. Accordingly, a copper film 14a is formed on the barrier metal layer 15 and copper is buried in the trench 100 (substantially the same state as the copper film 14a shown in FIG. 3D).

Figure 7D:
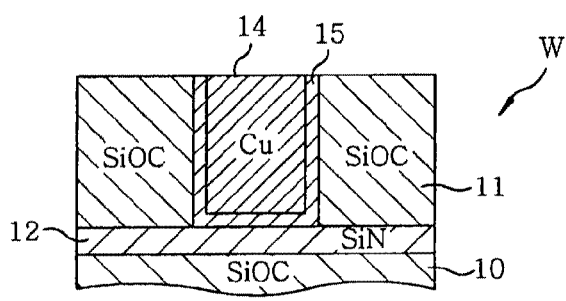

Subsequently, a chemical mechanical polishing (CMP) process is performed on the surface of the wafer W. Consequently, for example, the copper and the barrier metal layer 15 outside the trench 100 are removed, thereby forming a copper line 14 in the trench 100 (FIG. 7D).

In this case, ruthenium of the barrier metal layer 15 is a metal having a low oxidation tendency, wherein an enthalpy in combination of metal and oxygen is 407 kj/mol at a temperature of 200° C. such that the metal does not react with water vapor at a film forming temperature of copper. Accordingly, an oxide layer having poor adhesiveness to the copper film 14a is hardly formed even though the water vapor is supplied. Further, an organic impurity layer is hardly formed on the surface of ruthenium due to its low oxidation tendency.

In accordance with the second embodiment of the present invention, following effects can be obtained. Since the copper film 14a is formed on the barrier metal layer 15 of ruthenium having a low oxidation tendency, an organic impurity layer is hardly formed even though the Cu(hfac)TMVS is used as a material, and an oxide layer of ruthenium is hardly formed even though the water vapor is supplied. As a result, it is possible to improve the adhesiveness between the copper film and the barrier metal layer 15 and reduce troubles such as peel-off of the copper film in processing of the wafer W.

Further, since the barrier metal layer 15 is formed by CVD, it is possible to obtain the barrier metal layer 15 having no void even though the trench 100 is finely formed. Further, since the formation of the barrier metal layer 15 and the formation of the copper film are performed by using the same CVD apparatus 2a, it is advantageous in view of reductions in apparatus cost and processing time. Further, after the barrier metal layer 15 of ruthenium is formed, the copper film 14a is formed without breaking a vacuum state, so that it is possible to prevent the surface of ruthenium from being oxidized in the atmosphere.

Further, although the coating of the barrier metal layer 15 and the formation of the copper film are performed by using the same CVD apparatus 2a in the second embodiment of the present invention, these steps may be performed by using separate apparatuses. Further, the coating of the barrier metal layer 15 may be performed by sputtering or the like without being limited to CVD.

Further, although the barrier metal layer 15 is made of ruthenium in the second embodiment of the present invention, the metal having a low oxidation tendency available for the barrier metal layer 15 is not limited thereto. For example, metals having an oxidation tendency equal to and smaller than that of ruthenium may include iridium, silver, palladium, osmium and cobalt. Further, the barrier metal layer may be formed to have a two-layer structure, wherein a lower layer in contact with the SiOC film 11 is formed as a second base film made of, e.g., titanium (having a high oxidation tendency) easily forming an oxide film while it has a high copper diffusion barrier effect and an upper layer in contact with the copper film is formed as a base film made of ruthenium (having a low oxidation tendency) hardly forming an organic impurity layer or an oxide film.

Further, when the barrier metal layer employs a metal having a low oxidation tendency, there is an effect that an organic impurity layer is hardly formed when the copper film is formed by using the Cu(hfac)TMVS as a material. This effect is obtained regardless of whether the water vapor is supplied. Accordingly, the coating of the barrier metal layer 15 made of a metal having a low oxidation tendency and the formation of the copper film may be performed by using a CVD apparatus including no water vapor supply system. Also in this case, it is possible to realize reductions in apparatus cost and transfer time of the wafer W.

Example 1

Figure 8A:
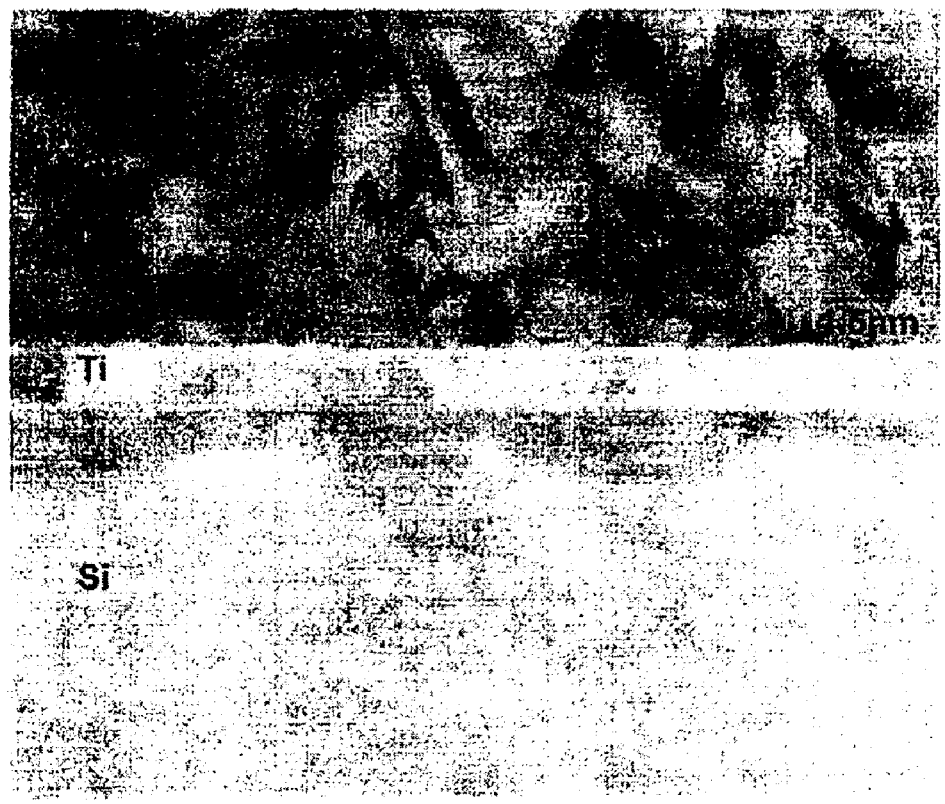
FIGS. 8A and 8B show results of Example and Comparison example performed to check the effects of the present invention.

The copper film was formed on the wafer W having a barrier metal layer made of titanium having a high oxidation tendency in accordance with the semiconductor device manufacturing method described in the first embodiment. An interface of the barrier metal layer and the copper film was photographed by SEM and the result thereof is shown in FIG. 8A. Further, film formation conditions are as follows.

(Film Formation Conditions of the Copper Film)
Barrier metal layer: titanium
Material of copper: Cu(hfac)TMVS
Film forming temperature (wafer temperature): 150° C.
Introduction of water vapor: Yes Comparison Example 1

Figure 8B:
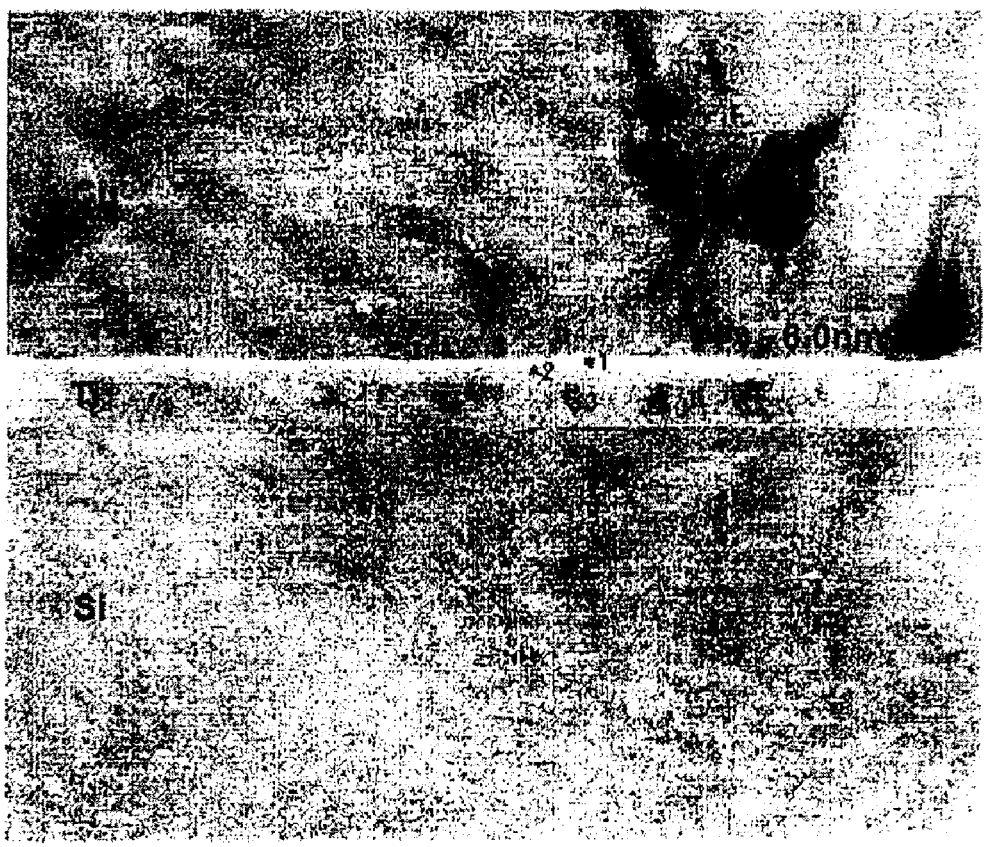

The copper film 14a was filmed under the same conditions as those of Example 1 except that the water vapor is not introduced. An interface of the barrier metal layer and the copper film was photographed by SEM and the result thereof is shown in FIG. 8B.

Consideration of Example 1 and Comparison Example 1

As shown in FIG. 8A, in Example 1 in which the copper film was formed in an environment containing water molecules with the supply of water vapor, an organic impurity layer was formed to have a thickness of 1.5 nm and, namely, the organic impurity layer was hardly formed. On the other hand, in Comparison example 1 without the supply of water vapor, as shown in FIG. 8B, an organic impurity layer was formed to have a thickness of 6 nm, which is four times that in the case performed with the supply of water vapor. The formation of the thick organic impurity layer deteriorates adhesiveness between the base film and the copper film.

Example 2

Figure 9A:
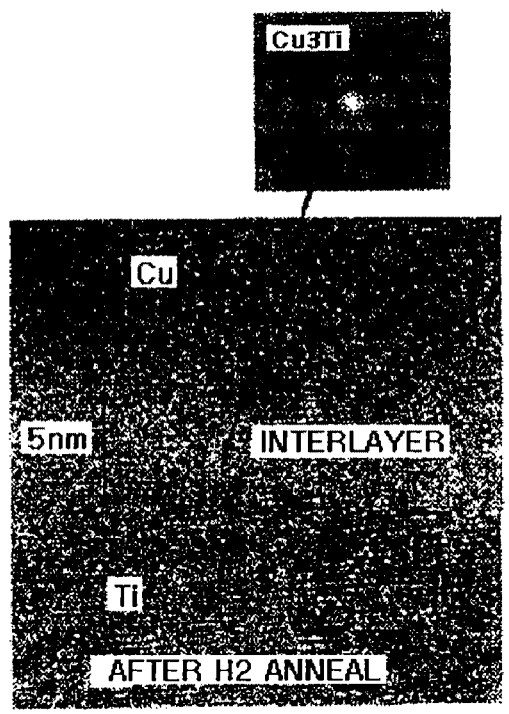
FIGS. 9A and 9B show results of Example and Comparison example performed to check the effects of the present invention.
Figure 9B:
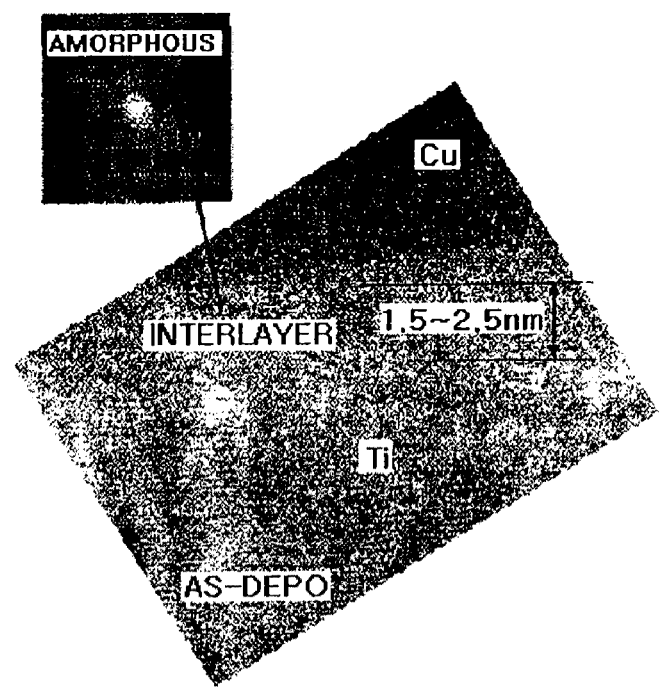

A heat treatment was performed on the wafer W obtained in Example 1. An interface of the copper film and the base film was photographed by SEM and the result thereof is shown in FIG. 9A. Further, heat treatment conditions are as follows.
(Heat Treatment Conditions)
Processing atmosphere: hydrogen atmosphere
Heat treatment temperature: 450° C.
Heating time: 30 minutes
Before the heat treatment performed on the wafer W obtained in Example 1, the interface of the copper film and the base film was photographed by SEM and the result thereof is shown in FIG. 9B.

Consideration of Example 2

As shown in FIG. 9A, in Example 2 in which the heat treatment was performed, it was checked that a film was formed at a thickness of about 5 nm at the interface between the barrier metal layer (Ti) and the copper film. When the film was observed in an enlarged state, a crystal structure of $Cu_3T_1$ was checked and it could be seen that an alloy layer of copper and titanium was formed. On the other hand, it was checked that a film was formed at a thickness of about 1.5 to 2.5 nm even before the heat treatment. When the film was observed in a further enlarged state, there was no crystal structure similar to that of Example 2 and an amorphous state was checked. It was considered as an oxide layer of titanium formed when the copper film was formed in an environment containing water molecules.

Example 3

In accordance with the semiconductor device manufacturing method described in the second embodiment of the present invention, ruthenium having a low oxidation tendency is coated as a barrier metal layer in each of trenches having widths of 90 nm and 80 nm. Then, the copper film was formed to bury copper in the trenches. The result thereof is shown in FIG. 10.

In the meantime, the barrier metal layer was formed to have a two-layer structure in which titanium nitride is coated as a lower layer by ionization PVD. Further, film formation conditions are as follows.

(Film Formation Conditions of the Barrier Metal Layer)
Lower layer: titanium nitride (coated by ionization PVD)
Upper layer: ruthenium (coated with $Ru_3(CO)_{12}$ by CVD, film forming temperature of 150° C.)
(Film Formation Conditions of the Copper Film)
Material of copper: Cu(hfac)TMVS
Film forming temperature (wafer temperature): 150° C.
Introduction of water vapor: Yes Consideration of Example 3

Figure 10:
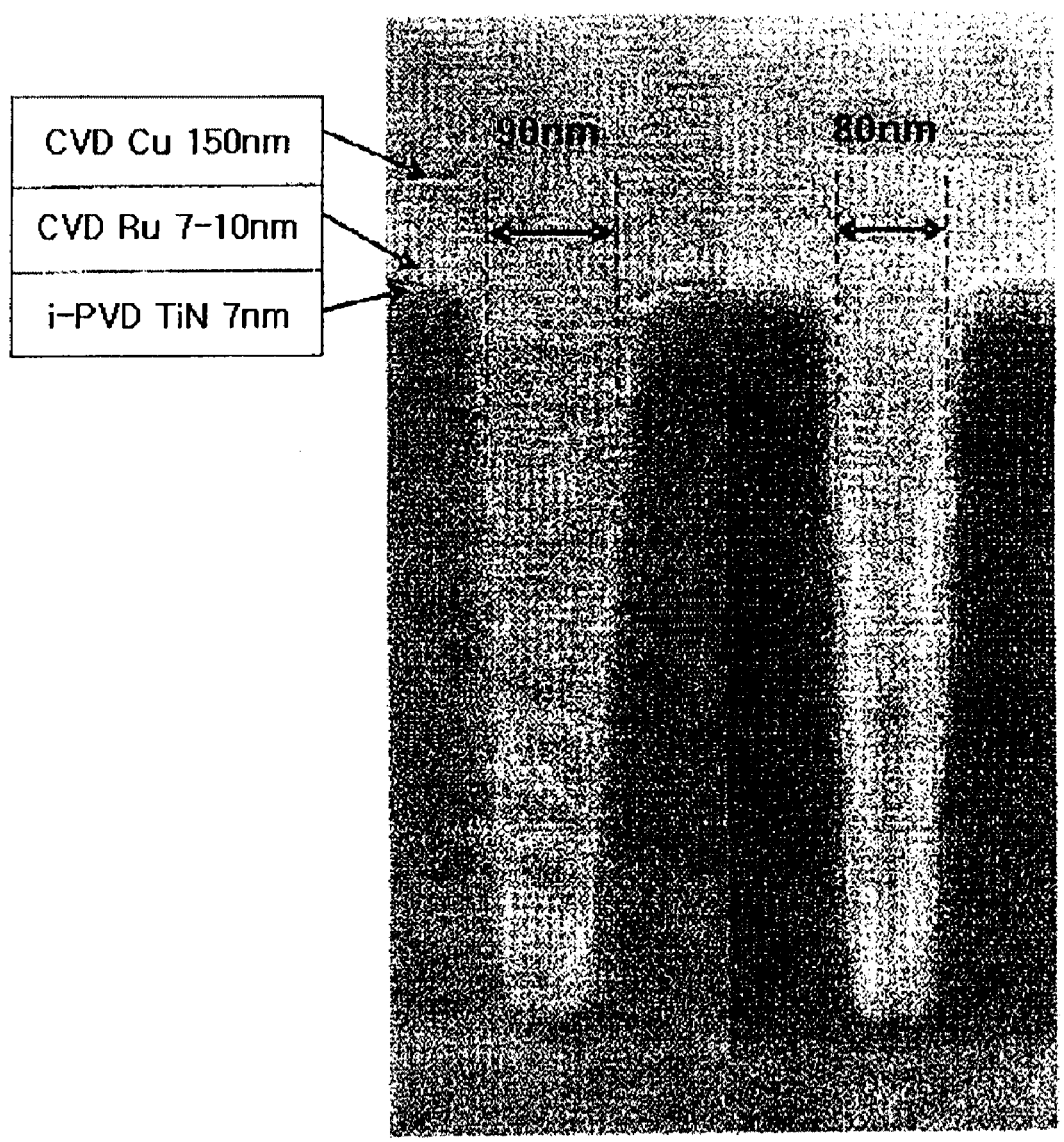
FIG. 10 shows a result of Example performed to check the effects of the present invention.

As shown in FIG. 10, an oxide layer was not checked between copper and ruthenium. Further, in both trenches having widths of 80 nm and 90 nm, copper could be uniformly buried without a void.

What is claimed is:

1. A semiconductor device manufacturing method comprising:
    placing a substrate having on its surface a base film made of a metal having a high oxidation tendency in an airtightly sealed processing chamber;
    supplying water vapor to the processing chamber;
    forming a copper film on a surface of the base film having an oxide layer formed due to the water vapor by supplying a source gas containing an organic compound of copper to the processing chamber while or after supplying the water vapor; and
    converting the oxide layer into an alloy layer of the metal forming the base film and copper by performing a heat treatment on the substrate having the copper film,
    wherein the alloy layer consists of the metal forming the base film and copper.

2. The semiconductor device manufacturing method of claim 1, wherein the metal having a high oxidation tendency is titanium or tantalum.

3. The semiconductor device manufacturing method of claim 1, wherein the metal having the high oxidation tendency has an enthalpy in combination of oxygen and the metal such that the metal reacts with the water vapor at a film forming temperature of copper.

4. The semiconductor device manufacturing method of claim 1, wherein the heat treatment is performed after said forming the copper film.

5. The semiconductor device manufacturing method of claim 1, wherein the metal for forming the base film is titanium and the alloy layer is $Cu_3Ti$.

* * * * *

UNITED STATES PATENT AND TRADEMARK OFFICE
CERTIFICATE OF CORRECTION

| | |
|---|---|
| PATENT NO. | : 8,133,811 B2 |
| APPLICATION NO. | : 12/374228 |
| DATED | : March 13, 2012 |
| INVENTOR(S) | : Yasuhiko Kojima et al. |

It is certified that error appears in the above-identified patent and that said Letters Patent is hereby corrected as shown below:

On the title page, Item (73), the Assignee's name is incorrect. Item (73) should read:

-- (73) Assignee: Tokyo Electron Limited, Tokyo (JP) --

Signed and Sealed this
Twenty-second Day of May, 2012

David J. Kappos
*Director of the United States Patent and Trademark Office*